United States Patent [19]
Hayashiyama et al.

[11] Patent Number: 6,014,094
[45] Date of Patent: Jan. 11, 2000

[54] DSV CONTROL SYSTEM

[75] Inventors: Takumi Hayashiyama, Yokosuka; Kazunari Matsui, Yokohama; Takaro Mori, Chigasaki, all of Japan

[73] Assignee: Victor Company of Japan, Ltd., Yokohama, Japan

[21] Appl. No.: 09/007,848

[22] Filed: Jan. 15, 1998

[51] Int. Cl.$^7$ .............................. H03M 5/00; H03M 7/00
[52] U.S. Cl. ................................. 341/58; 341/59
[58] Field of Search ................................. 341/58, 59, 95; 360/40; 369/59, 275.3; 386/126

[56] References Cited

U.S. PATENT DOCUMENTS

| | | | |
|---|---|---|---|
| 4,728,929 | 3/1988 | Tanaka | 341/73 |
| 5,638,064 | 6/1997 | Mori et al. | |
| 5,870,037 | 2/1999 | Okazaki et al. | 341/58 |
| 5,870,040 | 2/1999 | Ando | 341/58 X |

FOREIGN PATENT DOCUMENTS 08077717  3/1996  Japan .

*Primary Examiner*—Michael Tokar
*Assistant Examiner*—Patrick Wamsley
*Attorney, Agent, or Firm*—Michael N. Meller; Eugene Lieberstein

[57] ABSTRACT

A DSV (Digital Sum Value) control system for use in conversion of a sequence of m-bit digital data codes into at least first and second sequences of n-bit digital modulation codes using a plurality of modulation tables under the DVD (Digital Video Disc) standards, for example. The DSV control system outputs a sequence of modulation codes produced by selecting, in time sequence, one of the codes of the first sequence or one of the codes of the second sequence according to a select signal SB. The select signal SB is provided based on a DSV control enable flag indicating that DSV control enable codes of the first and second sequences will appear at a following address and a select signal SA indicating which of the DSV control enable codes of the first and second sequences should be selected in order to optimize a DSV of the outputted sequence of modulation codes.

8 Claims, 4 Drawing Sheets

| | | | | | | | | | | | | | | | | | | | | | |
|---|---|---|---|---|---|---|---|---|---|---|---|---|---|---|---|---|---|---|---|---|---|
| FIG. 2(a) | MAIN CODE SEQUENCE | M1 | M3 | M2 | M2 | M4 | M3 | M1 | M3 | M2 | M2 | M4 | M3 | M3 | M3 | M2 | ..... |
| FIG. 2(b) | SUB-CODE SEQUENCE | M2 | M3 | M2 | M1 | M2 | S1 | M2 | M3 | M1 | M2 | S2 | M2 | M3 | M1 | M2 | S3 | M2 | M3 | ..... |
| FIG. 2(c) | ADDRESS | 0 | 1 | 2 | 3 | 4 | 5 | 6 | 7 | 8 | 9 | 10 | 11 | 12 | 13 | 14 | 15 | 16 | 17 | ..... |
| FIG. 2(d) | POINTER ADDRESS | 0 | 0 | 0 | 0 | 0 | 5 | 5 | 5 | 5 | 5 | 10 | 10 | 10 | 10 | 10 | 15 | 15 | 15 | ..... |
| FIG. 2(e) | DSV CONTROL ENABLE FLAG | 0 | 0 | 0 | 0 | 0 | 1 | 0 | 0 | 0 | 0 | 1 | 0 | 0 | 0 | 0 | 1 | 0 | 0 | ..... |
| FIG. 2(f) | SELECT SIGNAL SA | X | X | X | X | 0 | X | X | X | X | 1 | X | X | X | X | 0 | X | X | X | ..... |
| FIG. 2(g) | SELECT SIGNAL SB | 1 | 1 | 1 | 1 | 1 | 0 | 0 | 0 | 0 | 0 | 1 | 1 | 1 | 1 | 1 | 0 | 0 | 0 | ..... |
| FIG. 2(h) | OUTPUT CODE SEQUENCE | M2 | M3 | M2 | M1 | M2 | M1 | M2 | M3 | M2 | M4 | M3 | M1 | M2 | M3 | M1 | M2 | M3 | M2 | ..... |

FA, FB, FC, FD

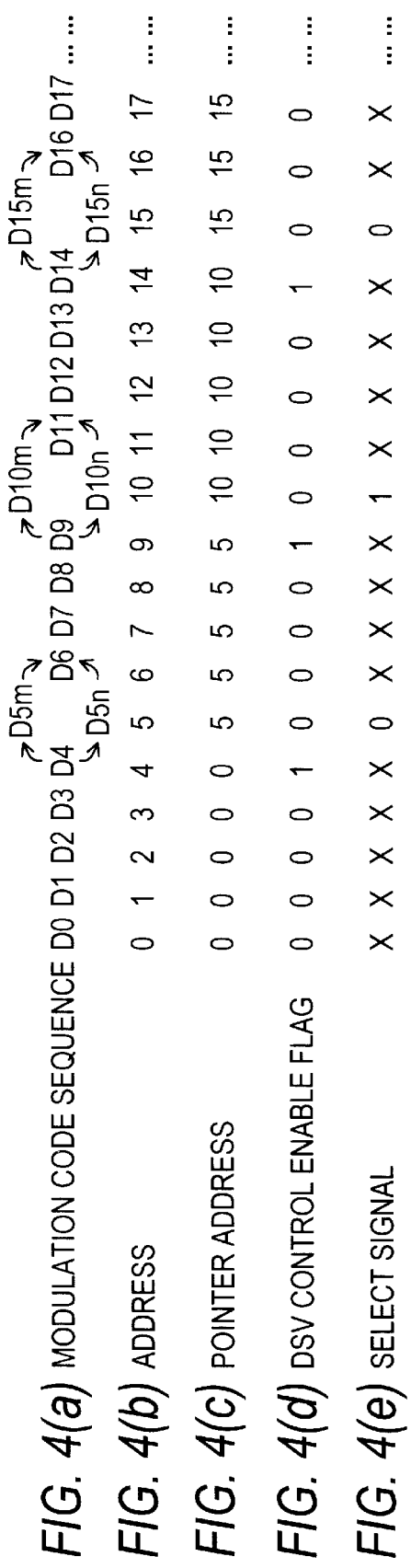

DSV CONTROL SYSTEM

BACKGROUND OF THE INVENTION

1 Technical Field of the Invention

The present invention relates generally to a DSV (Digital Sum Value) control system for DSV control in conversion of m-bit digital data codes into n-bit digital modulation codes using a plurality of modulation tables.

2 Background of Related Art

U.S. Pat. No. 5,638,064 to Mori et al., issued Jun. 10, 1997, assigned to the same assignee of this application, discloses a digital modulating/demodulating system which converts a sequence of m-bit data codes into a sequence of n-bit modulation codes using a single modulation table and, if one of the n-bit modulation codes meets a specified condition, changes it with another code for controlling a DSV of the sequence of n-bit modulation codes.

FIG. 3 shows a conventional DSV control system, as taught in Mori et al. In the following discussion, modulation codes into which digital data codes are converted using a modulation table (not shown) are, as shown in FIG. 4(a), expressed by D0, D1, D2, Modulation codes provided at the same address for DSV control are expressed by additional characters "m" and "n", respectively, which will be referred to as DSV control enable codes hereinafter. A modulation code sequence D0, D1, D2, D4, D5m, D6, . . . is generally expressed by "Dm", while a modulation code sequence D0, D1, D2, D4, D5n, D6, . . . is generally expressed by "Dn". "D" indicates one-byte data code.

The modulation code sequences Dm and Dn are supplied to memories 10 and 12. Each of the memories 10 and 12 includes a frame memory wherein 93 bytes are assigned to one frame, and data on a preceding frame is read out of a memory location specified by an address outputted from the address counter 14, while data on a current frame is written therein. Specifically, the data on a preceding frame is read out from each of the memories 10 and 12 during the first half of a period of time within which one-byte data is processed, and the data of a current frame is written during the second half.

The modulation code sequences Dm and Dn are also inputted to the DSV comparator 16. The DSV comparator 16 calculates DSVs of the modulation code sequences Dm and Dn every input of the modulation codes, respectively, to determine which of them is smaller and provides to the memory 18 a select signal indicating which of the modulation code sequences Dm and Dn should be selected. The memory 18 reads a select signal for a preceding frame out of a memory location specified by an address supplied from the address counter 14 and writes a select signal for a current frame in a memory location at a pointer address specified by the pointer register 20. Specifically, the select signal for a preceding frame is read out during the first half of a period of time within which one-byte data is processed, and the select signal for a current frame is written during the second half. The addresses supplied from the address counter 14 and the pointer addresses supplied from the pointer register 20 are different from each other.

The pointer register 20 consists of, for example, an enable latch circuit which latches an address supplied from the address counter 14 as an enable signal when a DSV control enable flag outputted from the DSV control decision circuit 22 indicates logical one (1) meaning that a DSV can be controlled. The data selector 24 is responsive to the select signal from the memory 18 to select one of data outputs from the memories 10 and 12 and outputs it.

The modulation code sequence, as shown in FIG. 4(a), will be discussed below in detail. In this example, DSV control enable modulation codes appear at address Nos. 5, 10, 15, . . . . The DSV control decision circuit 22 outputs a DSV control enable flag of one (1) at each of address Nos. 4, 9, 14, . . . , one byte before the address Nos. 5, 10, 15, (see FIG. 4(d)). The pointer register 20 is responsive to input of the DSV control enable flag of one (1) to latch, as shown in FIG. 4(c), an address supplied from the address counter 14. Specifically, address Nos. 5, 10, 15, . . . are latched and outputted as pointer addresses to the memory 18.

The DSV comparator 16 compares a DSV of a sequence of the modulation codes up to the address No. 9 when the modulation code D5m is selected at the address No. 5 with a DSV of a sequence of the modulation codes up to the address No. 9 when the modulation code D5n is selected at the address No. 5 and outputs a select signal for selecting the smaller one to the memory 18. The memory 18 receives the select signal and writes it at the pointer address No. 5 when the address No. 9 is reached. For example, when the modulation code D5m is selected at the address No. 5, logical zero (0) is written as a select signal in the pointer address No. 5. Alternatively, when the modulation code D5n is selected, logical one (1) is written as the select signal in the pointer address No. 5.

In this manner, the selection of one of the DSV control enable modulation codes D5m and D5n is achieved one byte ahead of the DSV control enable modulation codes D10m and D10n under feedback control. Note that select signals for all codes other than the DSV control enable modulation codes may be either of logical zero (0) and one (1) and stored as zero (0), for example.

In a data read out operation, the modulation code sequences Dm and Dn of a preceding frame are read out of the memories 10 and 12 according to addresses supplied from the address counter 14, while those of a current frame are stored therein. The modulation code sequences Dm and Dn read out of the memories 10 and 12 are supplied to the data selector 24. The select signals are read, in sequence, out of the memory 18 at the addresses supplied from the address counter 14 and outputted to the data selector 24.

The data selector 24 is responsive to the select signal from the memory 18 to select one of the codes of the modulation code sequence Dm or one of the codes of the modulation code sequence Dn and outputs it. For example, when the select signal shows, as shown in FIG. 4(e), logical zero (0) at the address No. 5, an output of the memory 10 is selected, and the DSV control enable modulation code D5m is outputted. Additionally, when the select signal shows the logical one (1) at the address No. 10, an output of the memory 12 is selected, and the DSV control enable modulation code D5n is outputted.

The conventional DSV control system, as described above, controls a DSV by changing a portion of a n-bit digital modulation code sequence, into which a m-bit digital code sequence is converted using one modulation table, with a specific modulation code meeting a given condition. It is, however, impossible to use this technique with, for example, a DVD (Digital Video Disc) system which produces a plurality of modulation code sequences using a plurality of modulation tables. This is because it is necessary to provide select signals one for each code of the modulation code sequences.

FIGS. 2(a) and 2(b) show, as examples, a main modulation code sequence and a sub-modulation code sequence which are converted using modulation tables under the DVD standards. The main modulation code sequence consists of codes M1, M3, M2, M4, M3, . . . . The sub-modulation code sequence consists of codes M2, M3, M2, M1, M2, . . . . The modulation code sequences Dm and Dn, as shown in FIGS. 4(a), are identical with each other except for the DSV control enable codes. Thus, the select signals may be set either to logical one (1) or zero (0) except those for the DSV control enable codes. However, in the examples, as shown in FIGS. 2(a) and 2(b), the main modulation code sequences and the sub-modulation code sequences are different from each other. It is, therefore, necessary to specify logical values of select signals one for each code of the main and sub-modulation code sequences. Specifically, it is impossible to use the above conventional DSV control system with DVD systems.

SUMMARY OF THE INVENTION

It is therefore a principal object of the present invention to avoid the disadvantages of the prior art.

It is another object of the present invention to provide a DSV control system capable of selecting, in sequence, one from codes of a plurality of modulation code sequences so as to optimize a DSV.

According to one aspect of the present invention, there is provided a DSV control system which comprises: (a) an address generating circuit generating and outputting addresses in sequence; (b) a first memory storing codes of a first modulation code sequence, into which a sequence of digital codes is converted using a first modulation table, at the addresses outputted from the address generating circuit; (c) a second memory storing codes of a second modulation code sequence, into which the sequence of digital codes is converted using a second modulation table, at the addresses outputted from the address generating circuit; (d) a DSV comparing circuit comparing a DSV of a third modulation code sequence and a DSV of a fourth modulation code sequence to provide a first select signal indicating one of the third and fourth modulation code sequences showing a smaller DSV when specified one of the addresses outputted from the address generating circuit is reached, the third modulation code sequence consisting of portions of the first modulation code sequence produced before a DSV control enable code of the first modulation code sequence appears and portions of the second modulation code sequence ranging from a DSV control enable code of the second modulation code sequence to the code at the specified one of the addresses outputted from the address generating circuit, the fourth modulation code sequence consisting of the portions of the first modulation code sequence produced before the DSV control enable code of the first modulation code sequence appears and portions of the first modulation code sequence ranging from the DSV control enable code to the code at the specified one of the addresses; and (e) a select signal generating circuit generating second select signals based on the first select signal for selecting, in sequence, one of the codes of the first modulation code sequence or one of the codes of the second modulation code sequence read out of the first and second memories so as to produce an output modulation code sequence identical with the one of the third and fourth modulation codes indicated by the first select signal.

In the preferred mode of the invention, the DSV control enable codes of the first and second modulation code sequences appear at the same address.

The specified one of the addresses outputted from the address generating circuit is an address one address before subsequent DSV control enable codes of the first and second modulation code sequences appear.

A DSV control enable flag generating circuit may further be provided which generates a DSV control enable flag indicating that the DSV control enable codes of the first and second modulation code sequences will appear at a following one of the addresses. The second select signals are produced by latching the first select signal based on the DSV control enable flag.

According to another aspect of the invention, there is provided a DSV control method comprising: (a) an address generating step generating and outputting addresses in sequence; (b) a first storing step storing codes of a first modulation code sequence, into which a sequence of digital codes is converted using a first modulation table, at the addresses outputted at the address generating step; (c) a second storing step storing codes of a second modulation code sequence, into which the sequence of digital codes is converted using a second modulation table, at the addresses outputted at the address generating step; (d) a DSV comparing step comparing a DSV of a third modulation code sequence and a DSV of a fourth modulation code sequence to provide a first select signal indicating one of the third and fourth modulation code sequences showing a smaller DSV when specified one of the addresses outputted at the address generating step is reached, the third modulation code sequence consisting of portions of the first modulation code sequence produced before a DSV control enable code of the first modulation code sequence appears and portions of the second modulation code sequence ranging from a DSV control enable code of the second modulation code sequence to the code at the specified one of the addresses outputted from the address generating circuit, the fourth modulation code sequence consisting of the portions of the first modulation code sequence produced before the DSV control enable code of the first modulation code sequence appears and portions of the first modulation code sequence ranging from the DSV control enable code to the code at the specified one of the addresses; and (e) a select signal generating step generating second select signals based on the first select signal for selecting, in sequence, one of the codes of the first modulation code sequence or one of the codes of the second modulation code sequence so as to produce an output modulation code sequence identical with the one of the third and fourth modulation codes indicated by the first select signal.

BRIEF DESCRIPTION OF THE DRAWINGS

The present invention will be understood more fully from the detailed description given hereinbelow and from the accompanying drawings of the preferred embodiment of the invention, which, however, should not be taken to limit the invention to the specific embodiment but are for explanation and understanding only.

In the drawings:

FIGS. 2(a) and 2(b) show main and sub-modulation code sequences produced using main and sub-tables;

FIG. 2(c) shows addresses produced by an address counter 14 in FIG. 1;

FIG. 2(d) shows pointer addresses produced by a pointer register 20 in FIG. 1;

FIG. 2(e) shows DSV control enable flags produced by a DSV control decision circuit 22 in FIG. 1;

FIG. 2(f) shows select signals SA each indicating which of DSV control enable codes of main and sub-modulation code sequences should be selected;

FIG. 2(g) shows select signals SB each indicating which of codes of the main and sub-modulation code sequences should be selected;

FIG. 2(h) shows a sequence of modulation codes outputted from a data selector 24 in FIG. 1;

FIG. 4(a) shows a modulation code sequence produced using a single modulation table;

FIG. 4(b) shows addresses produced by an address counter 14 in FIG. 3;

FIG. 4(c) shows pointer addresses produced by a pointer register 20 in FIG. 3;

FIG. 4(d) shows DSV control enable flags produced by a DSV control decision circuit 22 in FIG. 3; and FIG. 4(e) shows select signals each indicating which of DSV control enable codes should be selected.

DESCRIPTION OF THE PREFERRED EMBODIMENT

Figure 1:
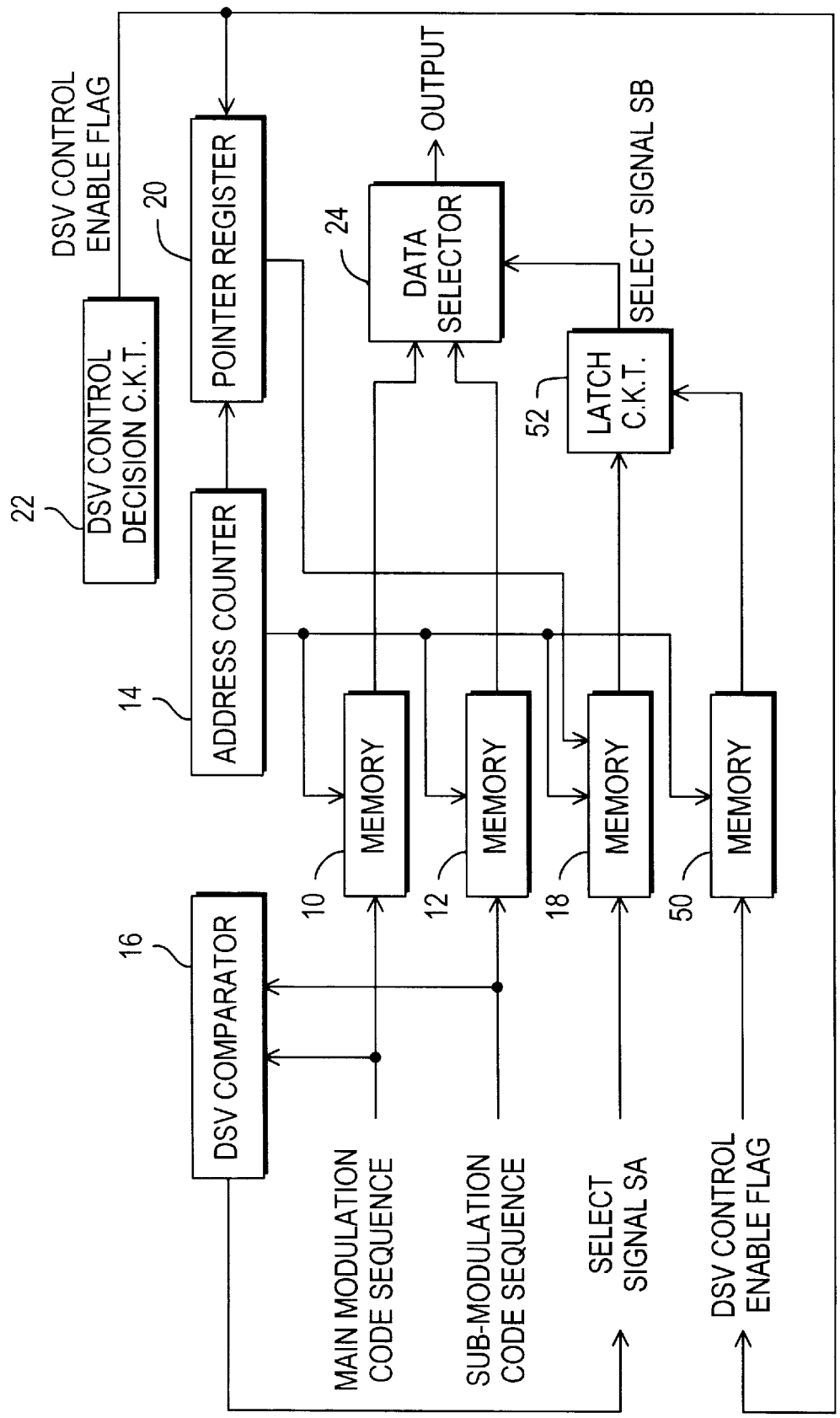
FIG. 1 is a circuit diagram which shows a DSV control system according to the present invention.
Figure 3:
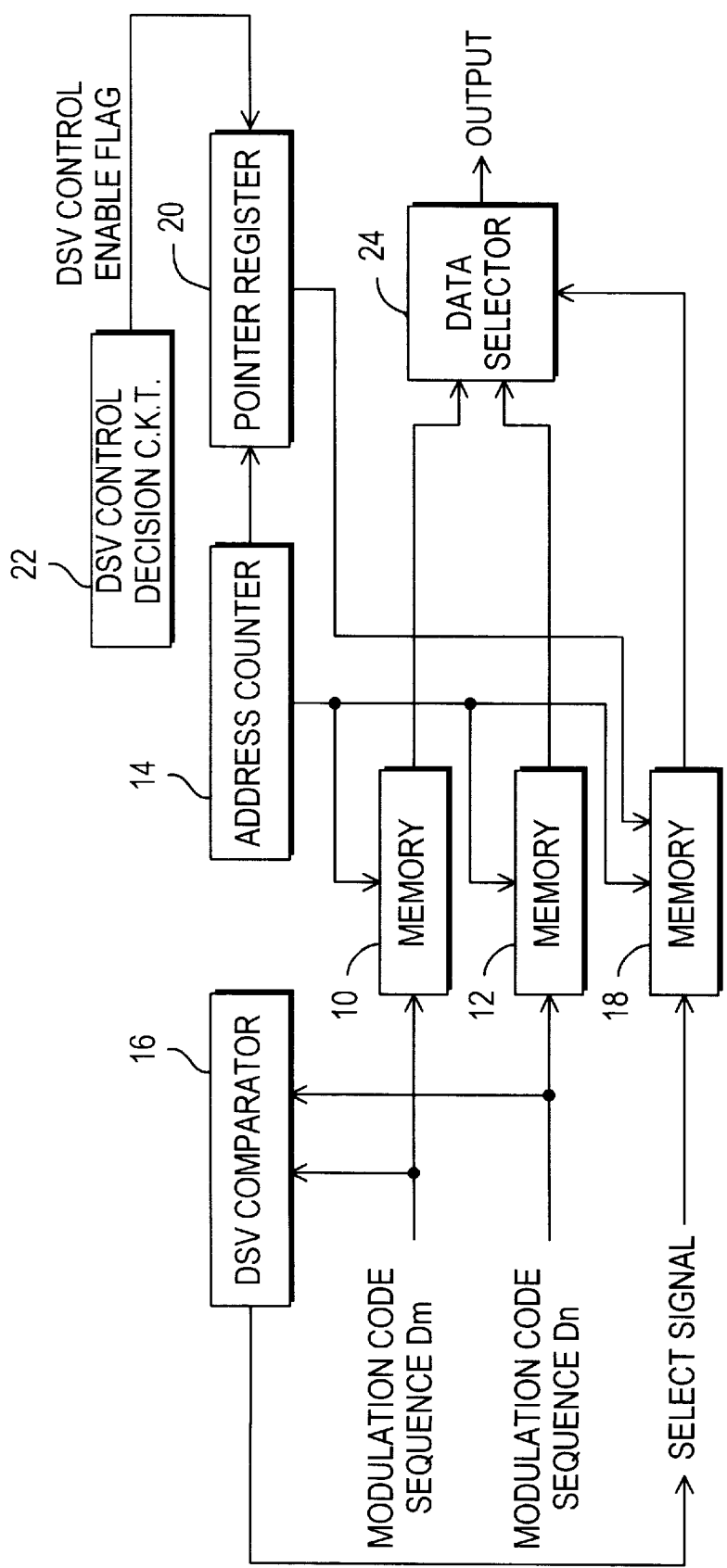
FIG. 3 is a circuit diagram which shows a conventional DSV control system.

Referring now to the drawings, particularly to FIG. 1, there is shown a DSV control system designed to control a DSV in conversion of a sequence of m-bit digital data codes into a plurality of sequences of n-bit digital modulation codes using a plurality of modulation tables. The same reference numbers as employed in FIG. 3 refer to the same parts, and explanation thereof in detail will be omitted here. FIG. 3 shows, as described in the introductory part of this application, the conventional DSV control system as taught in U.S. Pat. No. 5,638,064 to Mori et al., disclosure of which is incorporated herein by reference.

The main modulation code sequence and the sub-modulation code sequence, as shown in FIGS. 2(a) and 2(b), produced by converting a sequence of digital data codes using two modulation tables under the DVD (Digital Video Disc) standards, for example, are inputted to the memories 10 and 12. The address counter 14 is connected at an address output terminal to address input terminals of the memories 10, 12, 18, and 50 and the pointer register 20. The pointer register 20 is connected at a pointer address output terminal to an address input terminal of the memory 18. The memories 10 and 12 provide outputs to select signal input terminals of the data selector 24.

The main and sub-modulation code sequences are also supplied to the DSV comparator 16. The DSV operation comparator 16 calculates DSVs of two modulation code sequences, as will be described later in detail, selected provisionally to determine which of them is greater and provides to the memory 18 a select signal SA indicating which of the provisionally selected modulation code sequences should be selected. The DSV control decision circuit 22 outputs DSV control enable flags to an enable input terminal of the pointer register 20 and an input terminal of the memory 50. The memory 50 is connected at an output terminal to an enable input terminal of the latch circuit 52. The latch circuit 52 is connected at a latch input terminal to an output terminal of the memory 18 and at an output terminal to a selection control terminal of the data selector 24.

The memory 50 reads out the DSV control enable flag for each modulation code of a previous frame and stores a DSV control enable flag for each modulation code of a current frame from and in memory locations specified by addresses supplied from the address counter 14. These reading and storing operations are carried out during a period of time within which one-byte data is processed. The latch circuit 52 is responsive to the DSV control enable flag of one (1) read out of the memory 50 to latch one of the select signals SA outputted from the memory 18 and provides it as a select signal SB to the data selector 24.

In general, the DVD standards utilize two modulation tables: a main modulation table and a sub-modulation table for data code conversion. Each table is separated into four parts. DSV control enable codes are provided by the main and sub-modulation tables which optimize a DSV of a finally outputted sequence of modulation codes under the same feedback control as that of the conventional DSV control system, as shown in FIG. 3. Modulation codes other than the DSV control enable codes are provided by the main and sub-modulation tables so as to optimize maximum and minimum lengths between transitions.

The main and sub-modulation code sequences, as shown in FIGS. 2(a) and 2(b), are referred to in this embodiment as being produced under the DVD standards. Therefore, codes other than DSV control enable codes may be different between the main and sub-modulation code sequences. For example, in the main modulation code sequence, the fourth code at the address No. 3 is M4, while in the sub-modulation code sequence, the fourth code is M1. It is, thus, necessary to provide a select signal indicating which of codes of the main and sub-modulation code sequences should be selected at each address.

An operation of the DSV control system will be described below. In the following discussion, it is assumed that DSV control enable codes appear at the address Nos. 5, 10, 15, . . .

(1) Storing Data

The memories 10 and 12 store therein, in sequence, codes of the main and sub-modulation code sequences at addresses supplied from the address counter 14. The memory 50 stores therein the DSV control enable flags, in sequence, at the addresses supplied from the address counter 14.

The address counter 14 outputs a count value or address which, as shown in FIG. 2(c), sequentially increases as 0, 1, 2, 3, . . . . . The DSV control decision circuit 22 outputs the DSV control enable flag at each of the address Nos. 4, 9, 14, . . . one-byte ahead of one of the address Nos. 5, 10, 15, . . . at which the DSV control enable modulation codes appear. Specifically, the DSV control enable flag shows, as shown in FIG. 2(e), logical one (1) at the address Nos. 4, 9, 14, . . . and logical zero (0) at other address Nos.

The pointer register 20 latches one the addresses supplied from the address counter 14 in response to input of the DSV control enable flag of one (1). For example, when the DSV control enable flag changes from zero to one at the address No. 4, the pointer register 20 latches the address No. 5 and output it as a pointer address. Similarly, when the DSV control enable flag changes from zero to one at the address No. 9, the pointer register latches the address No. 10 and outputs it as the pointer address. In this manner, the pointer register 20 provides the pointer address Nos. 5, 10, 15, . . . specifying the DSV control enable codes to the memory 18.

When the count of the address counter 14 reaches, for example, the address No. 9, as indicated by FA in FIG. 2(a), at which the DSV control enable flag changes from zero to one, the DSV comparator 16 compares a DSV of a first modulation code sequence M2, M3, M2, M1, M2, M1, M3, M2, M4, M3) provided when a code string (M2, M3, M2, M1, M2) of the sub-modulation code sequence before the DSV control enable code appears at the address No. 5 proceeds, as shown by a straight arrow, to a code string (M1, M3, M2, M4, M3) of the main modulation code sequence with a DSV of a second modulation code sequence (M2, M3, M2, M1, M2, S1, M2, M3, M1, M2) provided when the code string (M2, M3, M2, M1, M2) of the sub-modulation code sequence proceeds, as shown by a curved arrow, directly to a following code string (S1, M2, M3, M1, M2) and outputs a select signal SA indicating which of the first and second modulation code sequences is smaller in the DSV to the memory 18. The memory 18 stores the select signal SA at the pointer address No. 5, as shown by FB in FIG. 2(f), when the address No. 9 is reached.

For example, when the code M1 of the main modulation code sequence is selected at the address No. 5, that is, when the first modulation code sequence is selected as showing the smaller DSV, the select signal SA of zero (0) is stored at the pointer address No. 5 in the memory 18. Alternatively, when the code S1 of the sub-modulation code sequence is selected at the address No. 5, that is, when the second modulation code sequence is selected as showing the smaller DSV, the select signal SA of one (1) is stored at the pointer address No. 5 in the memory 18. In the example shown in FIGS. 2(a) and 2(b), the code M1 is selected at the address No. 5, and thus the select signal SA of zero (0) is stored at the address No. 5 in the memory 18. The select signals SA for codes other than the DSV control enable codes, as indicated by "x" in FIG. 2(f), may be set to either of logical zero (0) and one (1).

The selection of the DSV control enable codes is, as apparent from the above discussion, substantially the same as that in the above described conventional DSV control system. Specifically, the DSV control system of this embodiment performs feedback control which determines which of the DSV control enable codes of the main and sub-modulation code sequences should be selected one byte ahead of the following DSV control enable codes.

(2) Reading Data

The codes of the main and sub-modulation code sequences are read out of the memories 10 and 12, in sequence, in response to inputs of the addresses from the address counter 14. Similarly, the select signals SA are read out of the memory 18 in response to inputs of the addresses from the address counter 14. The DSV control enable flags are read out of the memory 50 in response to inputs of the addresses from the address counter 14.

The latch circuit 52 receives as an enabling signal the DSV control enable flag outputted from the memory 50 and latches one of the select signals SA supplied from the memory 18. For example, at the address No. 5, the select signal SA which shows logical zero (0) is latched, as shown by FC in FIGS. 2(f) and 2(g), and outputted as a select signal SB. The select signal SB is kept unchanged until the latch circuit 52 latches one of the select signals SA again. Specifically, the select signal SB continues to show logical zero (0) until the DSV control enable flag is changed to logical one (1) at the address No. 9. Similarly, at the address No. 10, the select signal SA which shows the logical one (1) is latched, as shown by FD in FIGS. 2(f) and 2(g), and outputted as the select signal SB which is kept unchanged until the address No. 14. Specifically, the select signal SB keeps the value of the select signal SA which has appeared at the address of the DSV control enable code until the following DSV control enable code appears.

The latch circuit 52 outputs the select signals SB to the data selector 24 in sequence. The data selector 24 also receives the main and sub-modulation code sequences read out of the memories 10 and 12 and selects, in sequence, one of the codes of the main modulation code sequence or one of the codes of the sub-modulation code sequence according to the logical value of the select signal SB. In the example shown in FIGS. 2(a) to 2(h), when the select signal SB shows the logical zero (0), one of the codes of the main modulation code sequence read out of the memory 10 is selected. Alternatively, when the select signal SB shows the logical one (1), one of the codes of the sub-modulation code sequence read out of the memory 12 is selected. As a result of this selection, the data selector 24 provides a sequence of modulation codes, as shown in FIG. 2(h).

The above data storing and reading operations are carried out during the first half and second half of a period of time within which one-byte data is processed, respectively. Specifically, modulation codes of a preceding frame are first read out of the memories 10 and 12, and then modulation codes of a following frame are stored in the memories 10 and 12.

While the present invention has been disclosed in terms of the preferred embodiment in order to facilitate a better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims. For example, the invention may be used in DSV control of a plurality of modulation code sequences derived by use of modulation tables other than those specified in the DVD standards. When the number of modulation code sequences is more than three, the present invention may be used by increasing the number of bits of the select signals SA and SB. The circuit structure shown in FIG. 1 may be constituted by software in a computer.

What is claimed is:

1. A DSV control system comprising:

an address generating circuit generating and outputting addresses in sequence;

a first memory storing and outputting codes of a first modulation code sequence, into which a sequence of digital codes is converted using a first modulation table, at the addresses outputted from said address generating circuit;

a second memory storing and outputting codes of a second modulation code sequence, into which the sequence of digital codes is converted using a table different from said first modulation table, at the addresses outputted from said address generating circuit;

a DSV comparing circuit comparing a first DSV and a second DSV to provide a first select signal and storing the smaller of said first and second DSV, said first DSV calculating a stored DSV and a DSV of a portion of said first modulation code sequence ranging from a DSV control enable code of said first modulation code sequence to the code at a specified one of the addresses outputted from said generating circuit, said second DSV calculating the stored DSV and a DSV of a portion of said second modulation code sequence ranging from a DSV control enable code of said second modulation code sequence to the code at the specified one of the addresses outputted from said address generation circuit, said first select signal indicating the portion of said first modulation code sequence or the portion of said second modulation code sequence showing a smaller DSV:

a select signal generating circuit generating second select signals for selecting all codes of the portion of said first or second modulation code sequence indicated by said first select signal and outputting them until the next first select signal: and a selector selecting all the codes of the portion of said first modulation code sequence and the portion of said second modulation code sequence based on said second select signals from said select signal generating circuit.

2. A DSV control system as set forth in claim 1, wherein the DSV control enable codes of the first and second modulation code sequences appear at the same address.

3. A DSV control system as set forth in claim 2, wherein the specified one of the addresses outputted from said address generating circuit is an address one address before subsequent DSV control enable codes of the first and second modulation code sequences appear.

4. A DSV control system as set forth in claim 2, further comprising a DSV control enable flag generating circuit generating a DSV control enable flag indicating that the DSV control enable codes of the first and second modulation code sequences will appear at a following one of the addresses, and wherein the second select signals are produced by latching the first select signal based on the DSV control enable flag.

5. A DSV control method comprising the following steps:

an address generating step generating and outputting addresses in sequence;

a first storing and outputting step for storing and outputting codes of a first modulation code sequence, into which a sequence of digital codes is converted using a first modulation table, at the addresses outputted at said address generating step;

a second storing and outputting step for storing and outputting codes of a second modulation code sequence, into which the sequence of digital codes is converted using a table different from said first modulation table, at the addresses outputted at said address generating step;

a DSV comparing step comparing a first DSV and a second DSV to provide a first select signal and storing the smaller of said first and second DSV, said first DSV calculating a stored DSV and a DSV of a portion of said first modulation code sequence ranging from a DSV control enable code of said first modulation control sequence to the code at a specified one of the addresses outputted at said address generating step, said second DSV calculating the stored DSV and a DSV of a portion of said second modulation code sequence ranging from a DSV control enable code of said second modulation code sequence to the code at the specified one of the addresses outputted at said address generating step, said first select signal indicating the portion of said first modulation code sequence or the portion of said second modulation code sequence showing a smaller DSV;

a select signal generating step generating second select signals for selecting all codes of the portion of said first or second modulation code sequence indicated by said first select signal and outputting them until the next first select signal; and a selecting step selecting all the codes of the portion of said first modulation code sequence and the portion of said second modulation code sequence based on said second select signals generated at said select signal generating step.

6. A DSV control method as set forth in claim 5, wherein the DSV control enable codes of the first and second modulation code sequences appear at the same address.

7. A DSV control method as set forth in claim 6, wherein the specified one of the addresses outputted at said address generating stop is an address one address before subsequent DSV control enable codes of the first and second modulation code sequences appear.

8. A DSV control method as set forth in claim 6, further comprising a DSV control enable flag generating step generating a DSV control enable flag indicating that the DSV control enable codes of the first and second modulation code sequences will appear at a following one of the addresses, and wherein the second select signals are produced by latching the first select signal based on the DSV control enable flag.

* * * * *